(12) United States Patent
Kuroda

(10) Patent No.: US 6,467,189 B2
(45) Date of Patent: Oct. 22, 2002

(54) METHOD OF TRANSFERRING A MATERIAL FROM FIRST APPARATUS TO SECOND APPARATUS IN THE CLEAN ROOM AND AN ASSEMBLY LINE

(75) Inventor: Shigeki Kuroda, Miyagi (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/132,185

(22) Filed: Apr. 26, 2002

(65) Prior Publication Data

US 2002/0112363 A1 Aug. 22, 2002

Related U.S. Application Data

(62) Division of application No. 09/460,983, filed on Dec. 15, 1999.

(30) Foreign Application Priority Data

Apr. 9, 1999 (JP) .............................. 11-102574

(51) Int. Cl.[7] .................................. F26B 19/00
(52) U.S. Cl. .................. 34/210; 34/217; 34/236; 34/242; 34/417; 34/480; 34/87; 134/61; 134/82
(58) Field of Search .................. 34/210, 217, 231, 34/242, 417, 480, 87; 134/61, 82

(56) References Cited

U.S. PATENT DOCUMENTS

| 4,649,830 | A | 3/1987 | Tanaka |
| 4,682,927 | A | 7/1987 | Southworth et al. |
| 4,826,360 | A | 5/1989 | Iwasawa et al. |
| 4,923,352 | A | 5/1990 | Tamura et al. |
| 5,058,491 | A | 10/1991 | Wiemer et al. |
| 5,470,784 | A | 11/1995 | Coleman |
| 5,928,077 | A | 7/1999 | Kisakibaru |

FOREIGN PATENT DOCUMENTS

| JP | 11-016976 | 1/1999 |
| JP | 11-016984 | 1/1999 |
| JP | 11-024750 | 1/1999 |
| JP | 11-044443 | 2/1999 |

*Primary Examiner*—William C. Doerrler
*Assistant Examiner*—Mark S. Shulman
(74) *Attorney, Agent, or Firm*—Volentine Francos, PLLC

(57) ABSTRACT

A transport enclosure arranged between a first apparatus and a second apparatus, all located in a clean room, is shielded from the clean room and maintained a degree of cleanliness which is cleaner than that of the clean room. Accordingly, the volume of space within the clean room requiring the highest degree of cleanliness is minimized, thereby reducing overall costs.

4 Claims, 3 Drawing Sheets

METHOD OF TRANSFERRING A MATERIAL FROM FIRST APPARATUS TO SECOND APPARATUS IN THE CLEAN ROOM AND AN ASSEMBLY LINE

CROSS-REFERENCE TO RELATED APPLICATIONS

This is a divisional of application Ser. No. 09/460,983, filed Dec. 15, 1999, which is incorporated herein by reference in its entirety.

FIELD OF THE INVENTION

The present invention relates to an assembly line in a clean room, and particularly, the present invention relates to an assembly line located in the clean room of a semiconductor assembly plant, in which a high degree of cleanliness is required.

BACKGROUND OF THE INVENTION

Referring to FIG. 5, a semiconductor assembly line for manufacturing semiconductor devices is installed in a clean room 100. The assembly line includes many facilities such as a variety of manufacturing apparatuses 110 and measuring apparatuses 111 used to manufacture the semiconductor devices. The clean room is mainly made up of a first area 101 in which the apparatuses are located, and a second area 102 in which control units 120 for controlling the apparatuses are located and where workers 130 manage the control units 120. In the first area 101, generally, an automatic transport system 112, for example a transport robot, is used.

The clean room 100 requires a special high degree of cleanliness, particularly in the first area 101. Workers that enter the clean room 100 must first take an air shower while wearing dust free garments, dust free gloves, a dust free mask and clean shoes. If dust is somehow introduced into the clean room 100, the semiconductor devices manufactured in the clean room 100 may be defective.

It takes enormous cost and labor to manufacture a clean room and to maintain the cleanliness of the clean room. Particularly manufacturing and maintaining the first area 101 of the clean room is very expensive. Also, the larger the clean room, the more burdensome are the costs and labor.

SUMMARY OF THE INVENTION

The object of the invention is to provide a relatively inexpensive assembly system located in a clean room having a high degree of cleanliness.

To achieve the object, in the typical invention of the present application, a transporting enclosure arranged between first apparatus and second apparatus, all located in a clean room, is shielded from the clean room and maintained a second clean level cleaner than that of the clean room.

According to the present invention, the cleanest area, such as the first area, is minimized in the clean room. As the cleanest area which is the most expensive to manufacture, is minimized, it can be realized to manufacture the clean room more inexpensively than the conventional clean room.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, one embodiment is shown in which the present invention is applied to a semiconductor assembly line located in a clean room.

Figure 1:
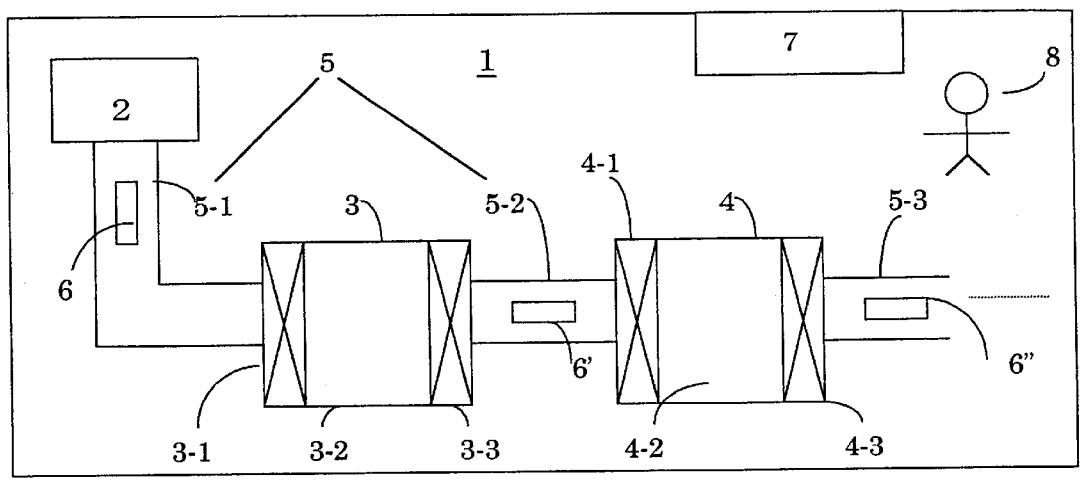
FIG. 1 is a plane view of a clean room according to a preferred embodiment of the present invention.

FIG. 1 is a plane view of a clean room according to a preferred embodiment of the present invention.

In FIG. 1, a semiconductor assembly system is located in the clean room 1. The clean room 1 is shielded from an external atmosphere and maintains a first degree of cleanliness. Herein, a particular degree of cleanliness is defined by a number of contaminants (such as dust) per unit volume.

A passing station 2, a first apparatus 3 and a second apparatus 4 are located in the clean room 1. A transport enclosure 5 is arranged between the passing station 2 and the first apparatus 3, and between the first apparatus 3 and the second apparatus 4.

The passing station 2 passes a semiconductor material 6 to the first apparatus 3 via a transport enclosure 5-1. In this embodiment, the semiconductor material 6 is a semiconductor wafer.

The first apparatus 3 and the second apparatus 4 each carry out any one of various semiconductor manufacturing processes, such as an etching process, deposition process, lithography process, ion implantation process, and so on.

The first apparatus 3 includes a first stage 3-1, a first chamber 3-2 and a second stage 3-3. The first stage 3-1 receives the semiconductor wafer 6 from the passing station 2 and introduces the semiconductor wafer 6 into the first chamber 3-2. The first chamber 3-2 receives the wafer 6 and treats the surface of the wafer with a first treatment. Then, the second stage 3-3 receives the treated wafer from the first chamber 3-2 and passes the treated wafer to the transport enclosure 5-2.

The transport enclosure 5-2 is arranged between the first apparatus 3 and the second apparatus 4. The transporting enclosure 5-2 transports the treated wafer 6' from the first apparatus 3 to the second apparatus 4. The transport enclosure 5 is shielded from the clean room 1 and is maintained at a second degree of cleanliness. Preferably, the second degree of cleanliness is at least two to five times higher (less contaminants per unit volume) than the first degree of cleanliness. In this embodiment, the transport enclosure is comprised of a tube and a transportation system which conveys the tube together with the semiconductor wafer. The transport system may be implemented by any well-known transport robot or belt conveyor or robot arm.

The second apparatus 4 includes a first stage 4-1, a second chamber 4-2 and a second stage 4-3. The first stage 4-1 receives the treated wafer 6' from the transport enclosure 5-2 and introduces the treated wafer 6' into the second chamber 4-2. The second chamber 4-2 receives the treated wafer 6' and treats the surface of the treated wafer 6' with a second treatment. Then, the second stage 4-3 receives the treated wafer from the second chamber 4-2 and passes the treated wafer 6" to the transport enclosure 5-3. The transport enclosure 5-3 then transfers the treated wafer 6" to an other apparatus (not shown).

A worker 8 putting on dust free garment works in the clean room 1. A control unit 7 is located in the clean room. The control unit 7 controls the first and second apparatus and the transport enclosure.

The insides of the passing station 2, the first apparatus 3-2, the second apparatus 4-2 and transport enclosure 5 are shielded from the clean room 1 and are maintained at a second degree of cleanliness level which is greater than that of the clean room 1. That is, the second degree of cleanliness is at a higher quality which is sufficient for manufacturing semiconductor devices.

Figure 5:
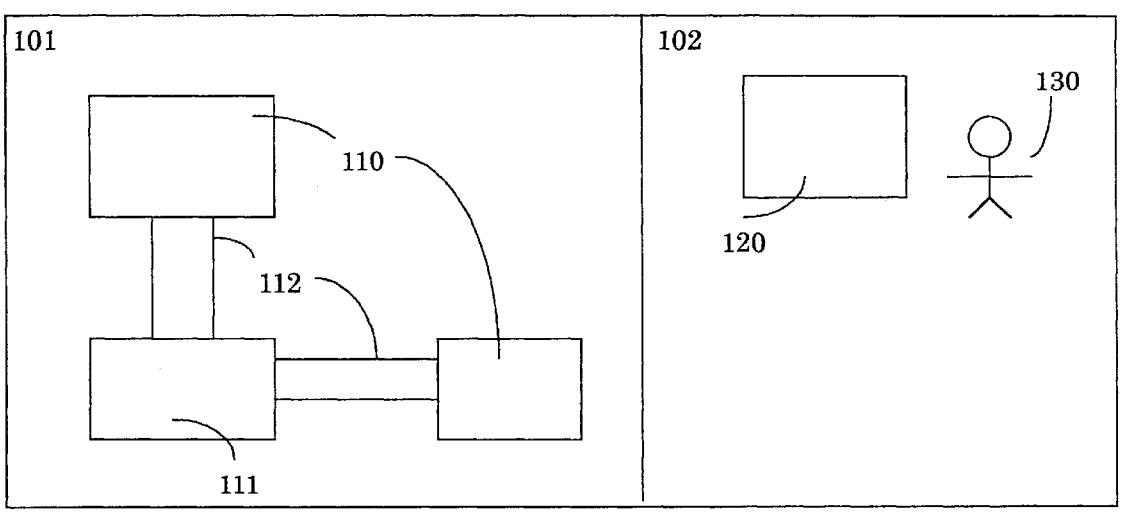
FIG. 5 is a plane view of a conventional clean room.

As described previously with reference to FIG. 5, in a conventional assembly facility, the entire first area 101 of the clean room 100 is maintained at the highest degree of cleanliness, since the first area contains the wafer as it is being processed by the various apparatuses also contained in the first area 101.

In contrast, according to the present invention, the space maintained at the highest degree of cleanliness is limited to the processing apparatuses and the transport enclosures extending therebetween. As such, the overall volume of space which must be maintained at the highest degree of cleanliness is substantially less than that of the conventional system. Accordingly, overall costs are reduced as well.

In one embodiment, the transport enclosure 5 is comprised of a plurality of tubes which may be combined with each other. Each tube is composed of translucent material or semitransparent material to allow for visual inspection inside the tube. For example, a translucent resin and a semitransparent glass are known translucent materials. The transport enclosure has a large enough cross section to allow for transfer of the semiconductor wafer therein. However, the space occupied by the transport enclosure is preferably smaller than that of the first or second apparatuses.

Figure 2:
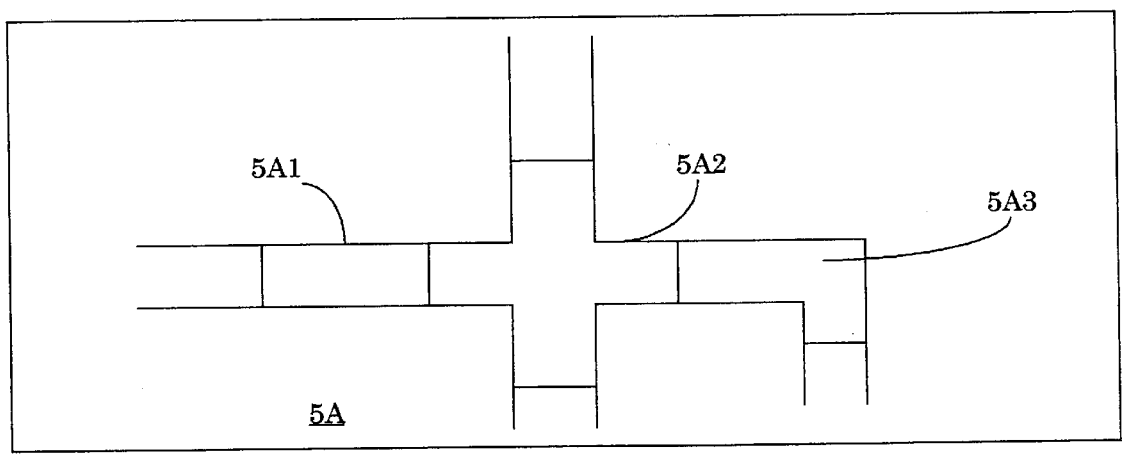
FIG. 2 is a plane view of a transport enclosure according to the preferred embodiment.

FIG. 2, a example of a network of tubes of the transport enclosure is shown. The tube 5A is a combination of a plurality of tube pieces 5A1, 5A2, 5A3. Each tube piece has a different length and configuration. The tube 5A is comprised of the straight tube piece 5A1, the crossing tube piece 5A2 and the bent tube piece 5A3. Thus, the composition of the plurality of tube pieces makes it possible to flexibly configure an assembly line. Further, it is relatively easy to change the assembly line to other configurations as the need arises.

Therefore, the tubes provide a mechanism to meet a request for a short TAT (Turn Around Time). Also, a problem in the assembly line can be easily identified by use the translucent material. Further, defective tube pieces can be easily replaced if necessary.

Figure 3:
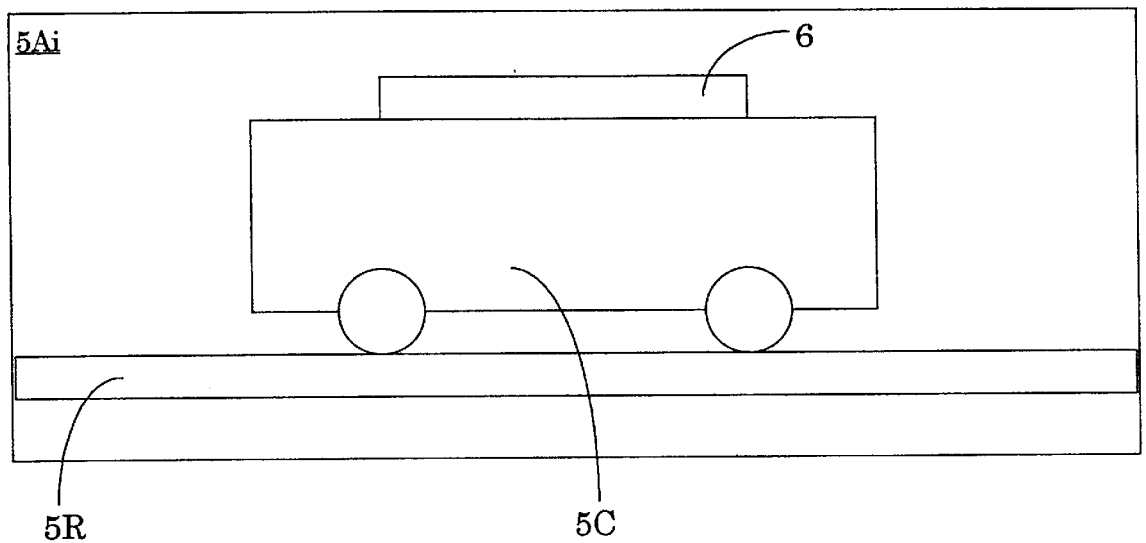
FIG. 3 is a cross section of the transporting enclosure according to the preferred embodiment.

FIG. 3 illustrates a cart 5C running on rails 5R laid at the bottom of the tube piece 5Ai. The cart 5C transfers the semiconductor wafer 6 between the apparatuses. The rails can be replaced with other transfer mechanisms, such as gear driven mechanisms (not shown). The use of gears makes it is possible to build the assembly line at an inclination, or to transfer the semiconductor wafer vertically.

Figure 4:
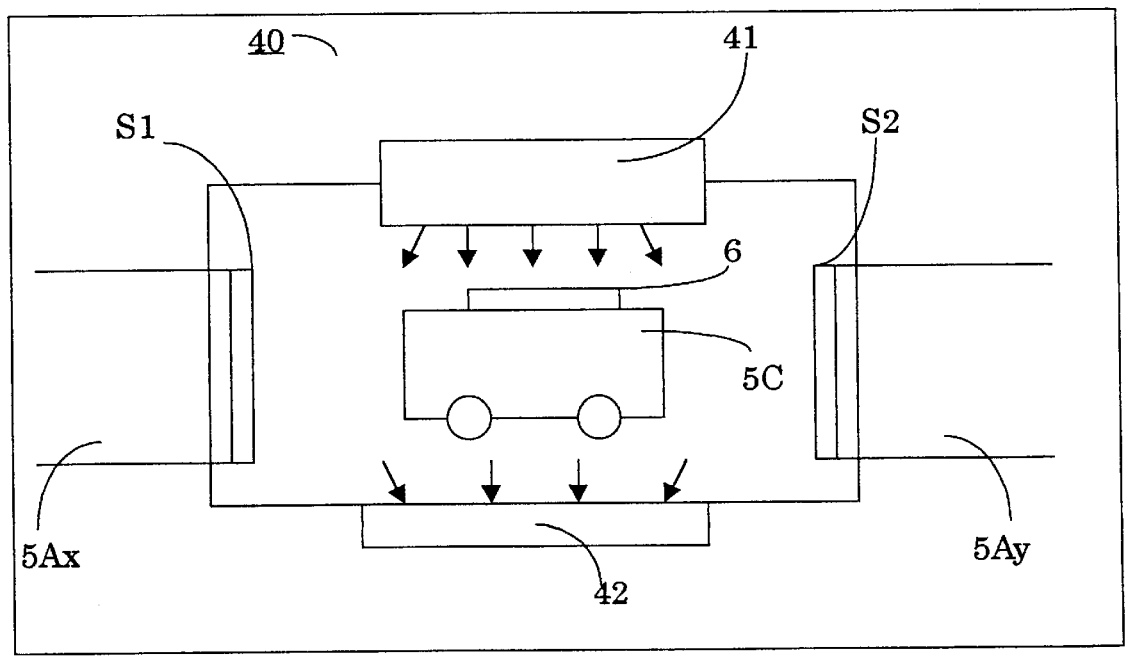
FIG. 4 is a cross section of another transport enclosure according to the preferred embodiment.

Next, as shown in FIG. 4, if the second apparatus 4 requires a third degree of cleanliness which is cleaner than the above-mentioned second degree of cleanliness of the first apparatus 3, a cleaning unit 40 is arranged between the first apparatus 3 and the second apparatus 4 within the transport enclosure 5.

The cleaning unit 40 is connected between the tube piece 5Ax and 5Ay. One end of the tube piece 5Ax is connected the second stage 3-3 of the first apparatus 3, and the other end is connected to the cleaning unit 40 through a first shutter S1. One end of the tube piece 5Ay is connected to the first stage 4-1 of the second apparatus 4, and the other end is connected to the cleaning unit 40 through a second shutter S2. The cleaning unit 40 includes a blowing unit 41 and an evacuating unit 42. The blowing unit 41 is provided with a plurality of blow holes which blow a clean gaseous material on the semiconductor wafer 6 in order to clean the wafer 6 and the cart 5C. The evacuating unit 42 is provided with a plurality of evacuation holes which evacuate the gaseous material. The gaseous material is used clean air. Generally, the cleaning unit 40 is called an air shower unit.

In this case, the inside of the first apparatus 3 and the tube piece 5Ax is maintained the second degree of cleanliness, and the inside of the second apparatus 4 and tube piece 5 is maintained the third degree of cleanliness.

The semiconductor wafer 6 is transferred by the cart 5C from the second stage 3-3 to the cleaning unit 40 when the first shutter S1 is opened and the second shutter S2 is closed. Then the semiconductor wafer 6 is cleaned when the first shutter S1 and the second shutter S2 are closed by blowing the gaseous material and evacuating the air. After cleaning, the semiconductor wafer 6 on the cart 5C is transferred from the cleaning unit 40 to the tube piece 5Ay when the first shutter S1 is closed and the second shutter S2 is opened.

The cleaning unit makes it possible to transfer the material between apparatuses having different degree of cleanliness. Therefore, it is easy to design an assembly line which requires a variety of cleanliness levels.

According to the present invention, the area within the clean room requires the highest degree of cleanliness is minimized. As such, manufacture costs are also minimized. Also, the present invention facilitates meeting a request for a short TAT as described above.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A method of transferring a material from a first chamber to a second chamber in a clean room, the clean room shielded from an external atmosphere and maintained a first degree of cleanliness, said method comprising:

depositing the material in the first chamber;

treating the material with a first treatment in the first chamber;

transporting the material from the first chamber to a second chamber through an enclosure which is shielded from the clean room and maintained at a second degree of cleanliness that is cleaner than the first degree of cleanliness;

treating the material in the second chamber.

2. The method according to the claim 1, further comprising:
controlling the first and second chambers using a control unit located in the clean room.

3. The method according to the claim 1, wherein the material is a semiconductor wafer.

4. The method according to claim 1, wherein the second degree of cleanliness is at least two times greater than the first degree of cleanliness.

* * * * *